(12) United States Patent
Murakami et al.

(10) Patent No.: US 8,451,613 B2
(45) Date of Patent: May 28, 2013

(54) TELEVISION AND ELECTRONIC APPARATUS

(75) Inventors: Ichioh Murakami, Akishima (JP); Shuya Takahashi, Akishima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/153,171

(22) Filed: Jun. 3, 2011

(65) Prior Publication Data
US 2012/0057310 A1 Mar. 8, 2012

(30) Foreign Application Priority Data
Sep. 7, 2010 (JP) ................ 2010-200213

(51) Int. Cl.
H05K 1/00 (2006.01)
H05K 1/18 (2006.01)
H05K 7/02 (2006.01)
H05K 7/06 (2006.01)
H05K 7/08 (2006.01)

(52) U.S. Cl.
USPC ....... 361/748; 361/679.09; 361/752; 361/761

(58) Field of Classification Search
USPC .............. 361/679.09, 704–710, 748, 761
See application file for complete search history.

(56) References Cited

U.S. PATENT DOCUMENTS

| 5,122,927 | A | * | 6/1992 | Satou ............... 361/679.09 |
| 5,905,633 | A | * | 5/1999 | Shim et al. ............ 361/704 |
| 6,798,031 | B2 | | 9/2004 | Honda et al. |
| 2002/0119658 | A1 | | 8/2002 | Honda et al. |
| 2003/0071342 | A1 | | 4/2003 | Honda et al. |
| 2006/0139887 | A1 | * | 6/2006 | Kameda ............... 361/704 |
| 2007/0210458 | A1 | | 9/2007 | Hagio |

FOREIGN PATENT DOCUMENTS

| JP | 2002-304130 | 10/2002 |
| JP | 2003 189195 | 7/2003 |
| JP | 2007-242773 | 9/2007 |
| JP | 2008-118075 | 5/2008 |
| JP | 2009-008731 A2 | 1/2009 |

OTHER PUBLICATIONS

Notice of Reasons for Rejection mailed by the Japanese Patent Office on Sep. 20, 2011 in corresponding Japanese patent app. No. 2010-200213 in 5 pages.

* cited by examiner

*Primary Examiner* — Tuan T Dinh
(74) *Attorney, Agent, or Firm* — Knobbe, Martens, Olson & Bear LLP

(57) ABSTRACT

According to one embodiment, an electronic apparatus includes a housing, a module in the housing, and an electrical interconnection. The housing includes a first portion, a second portion including a step between the first portion and the second potion, and a slope between the first portion and the second portion. The electrical interconnection extends from the first portion to the second portion via the slope and is electrically connected to the module.

8 Claims, 8 Drawing Sheets

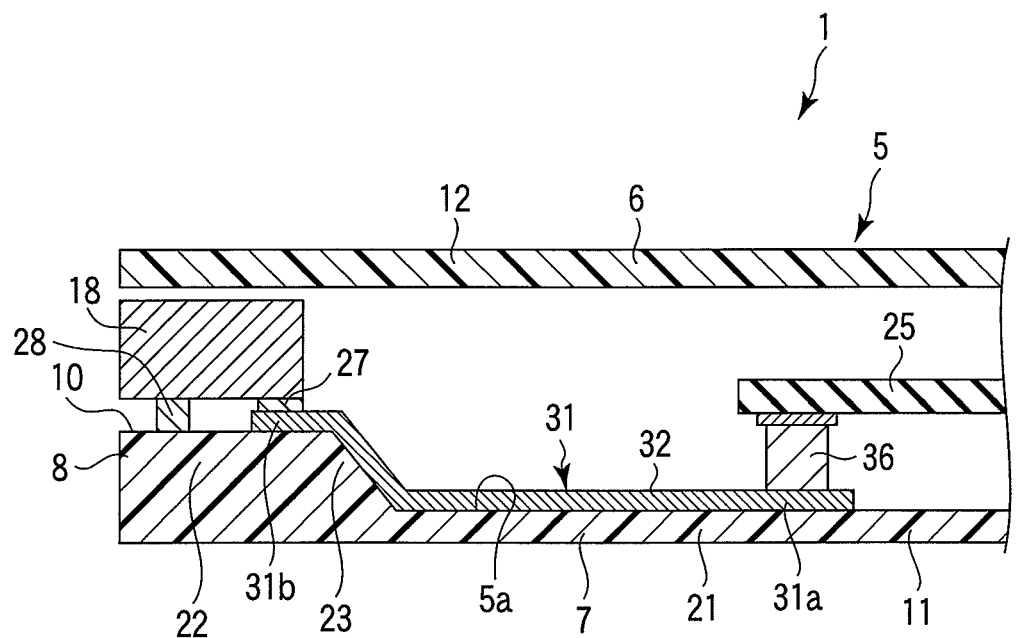
F I G. 2
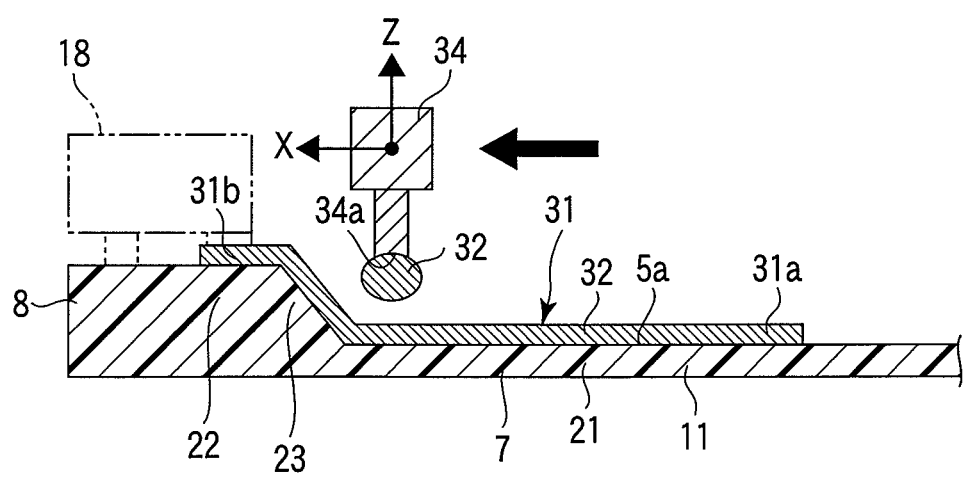
F I G. 3

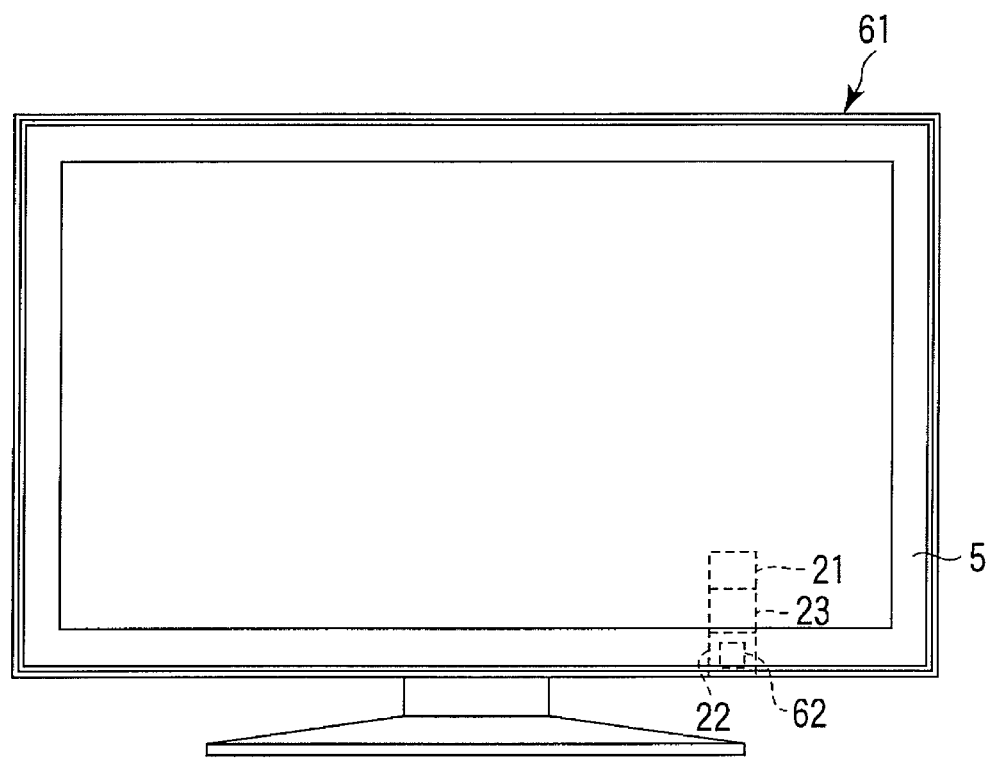
F I G. 12

TELEVISION AND ELECTRONIC APPARATUS

CROSS-REFERENCE TO RELATED APPLICATIONS

This application is based upon and claims the benefit of priority from Japanese Patent Application No. 2010-200213, filed Sep. 7, 2010; the entire contents of which are incorporated herein by reference.

FIELD

Embodiments described herein relate generally to a television and an electronic apparatus.

BACKGROUND

Techniques for forming the wiring by applying a conductive paste material are known.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 2 is an exemplary cross-sectional view of the electronic apparatus shown in FIG. 1 taken along line F2-F2;

FIG. 3 is an exemplary cross-sectional view illustrating a process of forming a wiring pattern shown in FIG. 2;

FIG. 12 is an exemplary front view of an example of a television according to a sixth embodiment.

DETAILED DESCRIPTION

Various embodiments will be described hereinafter with reference to the accompanying drawings.

In general, according to one embodiment, an electronic apparatus comprises a housing, a module in the housing, and an electrical interconnection. The housing comprises a first portion, a second portion comprising a step between the first portion and the second potion, and a slope between the first portion and the second portion. The electrical interconnection extends from the first portion to the second portion via the slope and is electrically connected to the module.

Hereinafter, embodiments will be described with reference to the accompanying drawings.

(First Embodiment)

Figure 1:
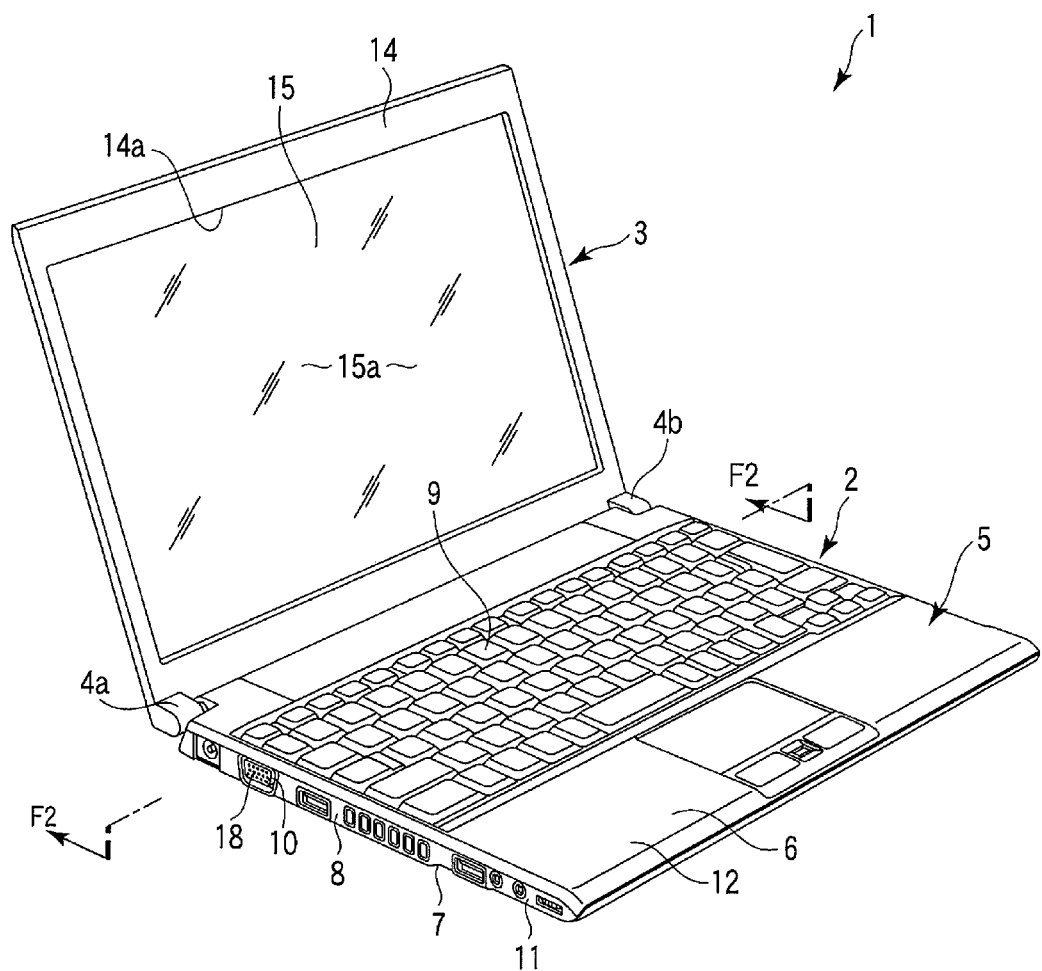
FIG. 1 is an exemplary perspective view of an example of an electronic apparatus according to a first embodiment.

FIGS. 1 to 3 show an electronic apparatus 1 according to a first embodiment. The electronic apparatus 1 is, for example, a notebook-type personal computer. Further, electronic apparatuses to which the first embodiment is applicable are not limited to the above-mentioned device. The first embodiment is widely applicable to various electronic apparatuses including, for example, televisions, recording and reproducing devices, personal digital assistants (PDA), and game machines.

As shown in FIG. 1, the electronic apparatus 1 includes a main unit 2, a display unit 3, and hinges 4a and 4b. The main unit 2 is a main electronic-device body provided with a main board. The main unit 2 includes a housing 5. The housing 5 includes a top wall 6, a bottom wall 7, and a peripheral wall 8, and is formed in a flat box shape.

The bottom wall 7 faces a top surface of a desk when the electronic apparatus 1 is placed on the desk. The bottom wall 7 becomes substantially parallel to the top surface of the desk. The top wall 6 extends substantially parallel to the bottom wall 7 (that is, substantially horizontally) with a space between the top wall 6 and the bottom wall 7. A keyboard 9 is mounted on the top wall 6. The peripheral wall 8 stands with respect to the bottom wall 7 and connects an edge portion of the bottom wall 7 and an edge portion of the top wall 6. The peripheral wall 8 includes, for example, a square opening portion 10.

The housing 5 includes a base 11 and a cover 12. The base 11 includes the bottom wall 7 and a part of the peripheral wall 8. The cover 12 includes the top wall 6 and a part of the peripheral wall 8. The cover 12 is combined with the base 11 so as to form the housing 5.

The housing 5 is made of, for example, plastic and has an electrical insulation property. Further, the housing 5 may be made of metal. In this case, on the whole or a part of an inner surface of the housing 5, an electrically insulating coating layer is provided, whereby the housing 5 has the electrical insulation property.

The display unit 3 is rotatably (openably and closably) joined with a rear end portion of the main unit 2 by the hinges 4a and 4b. The display unit 3 is rotatable between a closed position in which the display unit 3 falls to cover the main unit 2 from above and an open position in which the display unit 3 stands with respect to the main unit 2.

As shown in FIG. 1, the display unit 3 includes a display housing 14 and a display panel 15 in the display housing 14. A display screen 15a of the display panel 15 is exposed to the outside through an opening portion 14a in a front wall of the display housing 14.

Next, a connector mounting configuration of the first embodiment will be described in detail.

As shown in FIG. 1, in the opening portion 10 of the peripheral wall 8 of the housing 5, a connector 18 is disposed. The connector 18 is, for example, an I/O connector capable of being connected to an external device, and is exposed to the outside through the opening portion 10. The connector 18 is an example of a "module (first module)". Also, a module to which the first embodiment is applicable is not limited to the connector 18 but may be various kinds of semiconductor chips such as a ball grid array (BGA), or various kinds of electronic components such as resistors, capacitors, and transistors.

As shown in FIG. 2, the bottom wall 7 of the housing 5 includes a first portion 21, a second portion 22, and a slope 23. Each of the first portion 21, the second portion 22, and the slope 23 has a surface which is exposed in the housing 5 and is a part of an inner surface 5a of the housing 5.

As compared to the second portion 22, the first portion 21 is closer to a central portion of the housing 5. The first portion 21 is a base portion of the bottom wall 7 and has, for example, a relatively small thickness. The first portion 21 faces, for example, a circuit board 25. The circuit board 25 is, for example, a main board and is an example of "another module (second module)". Also, the second module is not limited to the circuit board 25 but may be any component to be electrically connected to the first module.

The second portion 22 is at a peripheral portion of the housing 5. The second portion 22 is adjacent to the opening portion 10 of the peripheral wall 8. The second portion 22 is a base on which the connector 18 is mounted. The second portion 22 is stepped with respect to the first portion 21 and is higher than the first portion 21.

The connector 18 is near a central portion of the housing 5 in the thickness direction of the electronic apparatus 1. An example of the reason why the connector 18 is near the central portion of the housing 5 in the thickness direction of the electronic apparatus 1 is to easily insert and pull out a plug, but the reason may be to improve the design thereof or other reasons. Since the second portion 22 is bulged with respect to the first portion 21, the connector 18 is near the central portion of the housing 5 in the thickness direction of the electronic apparatus 1.

As shown in FIG. 2, the slope 23 is a tapered step portion and has a slope surface inclined with respect to the first portion 21 and the second portion 22. The slope 23 is between the first portion 21 and the second portion 22 to smoothly connect the first portion 21 and the second portion 22.

The connector 18 is on the top surface of the second portion 22 of the housing 5 (that is, the inner surface 5a of the housing 5). That is, the connector 18 is directly on the housing 5, not on the circuit board 25. The connector 18 includes a connector terminal 27 (connector electrode) and a reinforcement pin 28. The connector terminal 27 and the reinforcement pin 28 are on a bottom surface of the connector 18.

As shown in FIG. 2, on the inner surface 5a of the housing 5, a wiring pattern 31 (i.e., an electrical interconnection) is integrated with the housing 5. The wiring pattern 31 is, for example, signal wiring pattern for electrically connecting the connector 18 to the circuit board 25. The wiring pattern 31 is formed by applying a conductive adhesive 32 to the inner surface 5a of the housing 5 in a line shape. The conductive adhesive 32 is applied to the inner surface 5a of the housing 5 by, for example, a dispenser 34 (see FIG. 3).

As shown in FIG. 2, the wiring pattern 31 is formed to extend over the first portion 21, the second portion 22, and the slope 23 of the housing 5. That is, the wiring pattern 31 extends from the first portion 21 to the second portion 22 through the slope 23. The wiring pattern 31 includes a first end portion 31a on the first portion 21 and a second end portion 31b on the second portion 22.

The first portion 21 includes a land (not shown) and is electrically connected to the circuit board 25 through, for example, a connector terminal 36. The second end portion 31b includes a land (not shown) and is electrically connected to the connector terminal 27 of the connector 18.

Next, an example of a method of forming the wiring pattern 31 will be described.

As shown in FIG. 3, the conductive adhesive 32 (paste) is supplied to a portion to be bonded with the connector terminal 27 of the connector 18 and a wiring portion extending from there by using the dispenser 34.

Next, the connector 18 is mounted at a predetermined position. Then, the conductive adhesive 32 is hardened at normal temperature or by heating. As a result, the wiring pattern 31 is formed.

According to this configuration, it is possible to easily form the wiring pattern 31 on a step portion in the housing 5.

In the case without the slope 23, a vertically steep step portion exists between the first portion 21 and the second portion 22 of the housing 5. The dispenser 34 generally orients an ejection port 34a, which supplies the conductive adhesive 32, downward and is capable of movement only along 3 axes in a front-rear direction (X direction), a left-right direction (Y direction), and an up-down direction (Z direction). For this reason, it is difficult to apply the conductive adhesive 32 to a side surface of the vertically steep step portion.

Meanwhile, in the first embodiment, the slope 23 is between the first portion 21 and the second portion 22 of the housing 5 and no vertically steep step portion exists on a route of application of the conductive adhesive 32. For this reason, it is possible to easily form the wiring pattern 31 extending from the first portion 21 to the second portion 22 through the slope 23 without discontinuities even by the dispenser 34 capable of movement only along 3 axes.

Therefore, it is possible to extend the wiring pattern 31 from a module at a portion, stepped with respect to another portion, to another portion via the step portion in the housing 5. Thus, it is possible to achieve, for example, miniaturization of the circuit board and implement a higher-density package.

(Second Embodiment)

Next, an electronic apparatus 1 according to a second embodiment will be described with reference to FIGS. 4 to 7E. Further, components having functions which are the same as or similar to the components of the first embodiment are denoted by identical reference symbols, and a description thereof is omitted. Also, components other than components to be described below are the same as those in the first embodiment.

Figure 4:
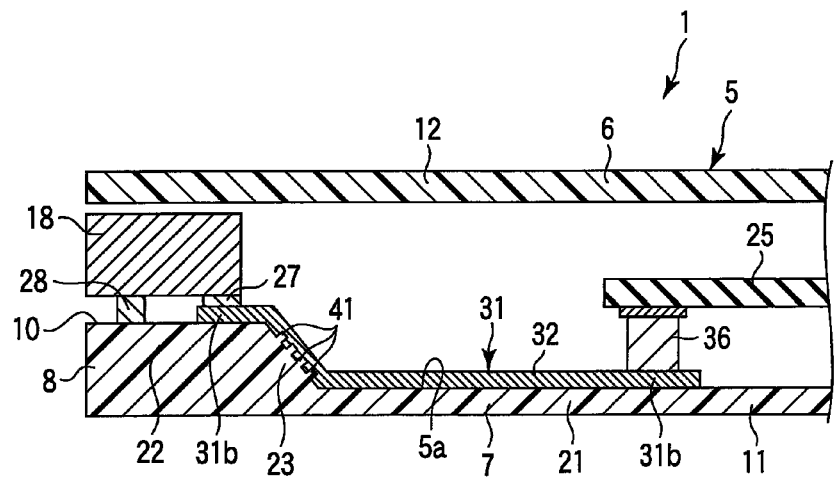
FIG. 4 is an exemplary cross-sectional view of an example of an electronic apparatus according to a second embodiment.

As shown in FIG. 4, a housing 5 according to the second embodiment includes a slope 23 having a surface with recesses, protrusions, and the like. If several concrete examples are given, the slope 23 may have a plurality of protrusions 41 (see FIG. 5A), may have a plurality of recesses 42 (see FIG. 5B), or may have both the protrusions 41 and the recesses 42.

Figure 5A:
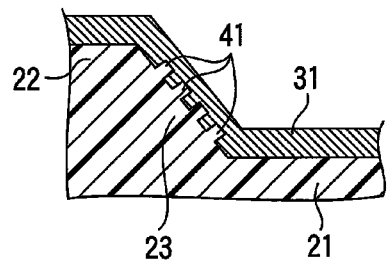
FIGS. 5A, 5B and 5C are exemplary cross-sectional views illustrating several examples of a slope according to the second embodiment.
Figure 5B:
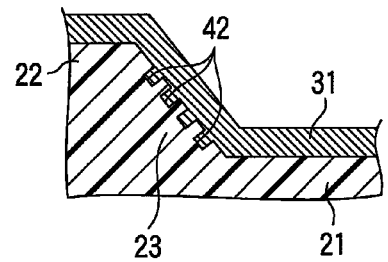
Figure 5C:
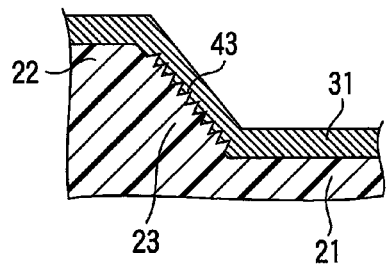

Also, the slope 23 may have, for example, a rough surface 43 (see FIG. 5C). The surface roughness of the slope 23 with the rough surface 43 is larger than, for example, a second portion 22. A conductive adhesive 32 is attached to the protrusions 41, the recesses 42, or the rough surface 43.

Figure 6A:
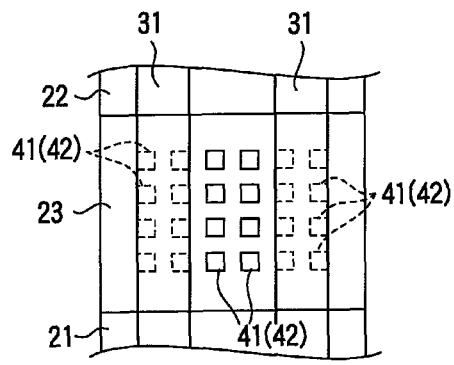
FIGS. 6A, 6B, 6C, 6D and 6E are exemplary plan views illustrating several examples of protrusions and recesses according to the second embodiment.
Figure 6B:
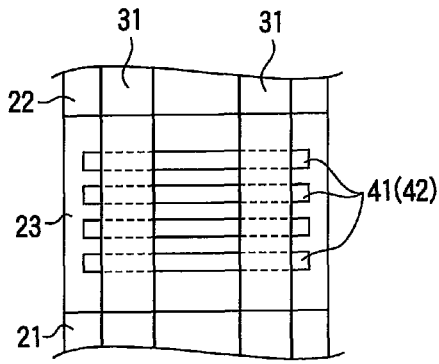
Figure 6C:
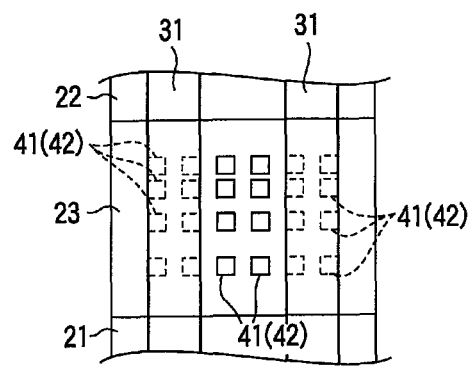
Figure 6D:
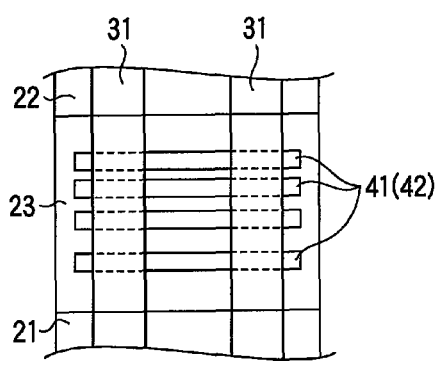
Figure 6E:
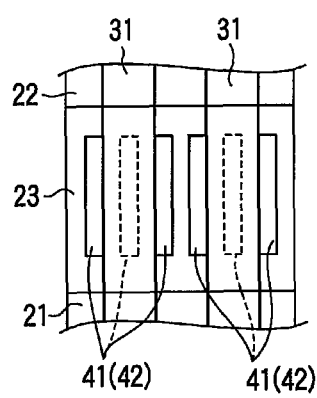

Further, the protrusions 41 may be formed in various shapes such as square protrusions arranged in an approximately regular lattice (see FIG. 6A), horizontally long protrusions arranged approximately regularly in a vertical direction (see FIG. 6B), square protrusions arranged with sparseness and denseness (see FIG. 6C), horizontally long protrusions arranged with sparseness and denseness (see FIG. 6D), or vertically long protrusions arranged in a horizontal direction (see FIG. 6E). Here, the extension direction of the wiring pattern 31 is defined as a vertical direction and a direction substantially perpendicular to the vertical direction is defined as a horizontal direction.

Further, the recesses 42 may be formed in shapes obtained by replacing the protrusions 41 in each of the shapes of FIGS. 6A to 6E with the recesses 42. Moreover, as shown in FIGS. 7A to 7E, the protrusions 41, the recesses 42, or the rough surface 43 may be formed only in a region to which the conductive adhesive 32 is applied.

Figure 7A:
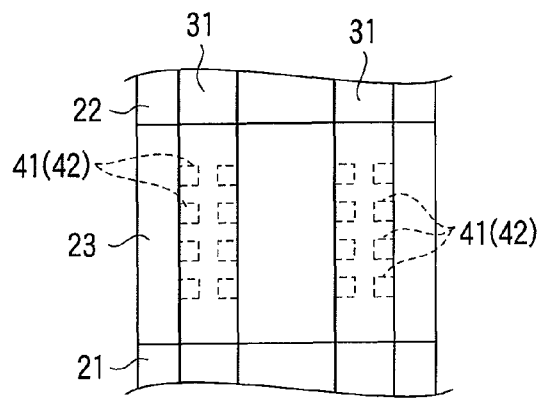
FIGS. 7A, 7B, 7C, 7D and 7E are exemplary plan views illustrating several other examples of the protrusions and the recesses according to the second embodiment.
Figure 7B:
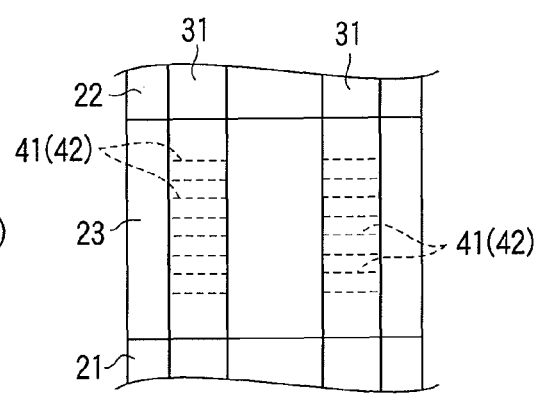
Figure 7C:
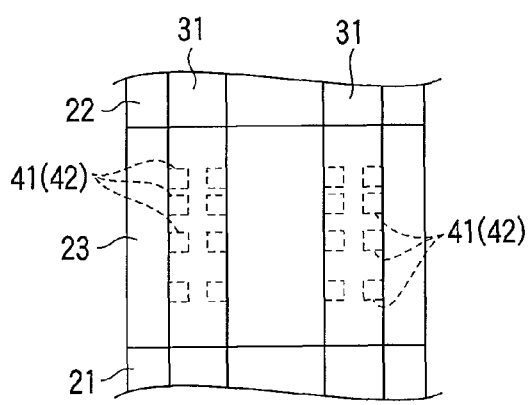
Figure 7D:
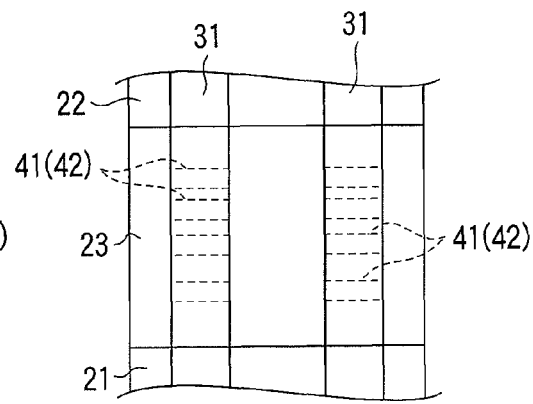
Figure 7E:
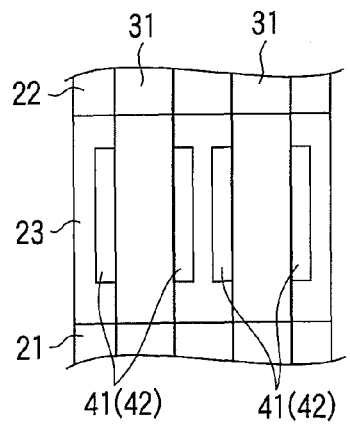

Here, the protrusions 41 of the slope 23 related to FIGS. 6E and 7E are a pair of wall portions standing on both sides of the wiring pattern 31, respectively, and extending in the extension direction of the wiring pattern 31. The wall portions are in contact with both sides of the wiring pattern 31 and the wiring pattern 31 has a width regulated to be approximately constant.

According to this configuration, like the first embodiment, it is possible to easily form the wiring pattern 31 on a step portion in the housing 5.

In the second embodiment, the slope 23 is provided with the protrusions 41, the recesses 42, or the rough surface 43. According to the slope 23, the conductive adhesive 32 is attached to the protrusions 41, the recesses 42, or the rough surface 43 to improve the adhesion between the conductive adhesive 32 and the housing 5. Therefore, resistance of the wiring pattern 31 against, for example, disconnection is improved and the reliability of the electronic apparatus 1 is improved.

Moreover, in the slope 23 with the protrusions 41, the recesses 42, or the rough surface 43, it is easy to maintain the position of the pre-hardening conductive adhesive 32 applied to the slope 23, and shear droop of the conductive adhesive 32 is suppressed. Therefore, it is easy to form the wiring pattern 31 as intended and the reliability of the electronic apparatus 1 is further improved.

Also, an example of the slope 23 includes a pair of wall portions standing on both sides of the wiring pattern 31, respectively. In this slope 23, the wall portions serve as dams such that the conductive adhesive 32 flows along the wall portions and is hardened. For this reason, the width of the wiring pattern 31 becomes approximately constant. The impedance of the wiring pattern 31 with the approximately uniform width becomes approximately constant and electrical stability thereof is improved.

(Third Embodiment)

Next, an electronic apparatus 1 according to a third embodiment will be described with reference to FIGS. 8 to 9C. Further, components having functions which are the same as or similar to the components of the second embodiment are denoted by identical reference symbols, and a description thereof is omitted. Also, components other than components to be described below are the same as those in the second embodiment.

Figure 8:
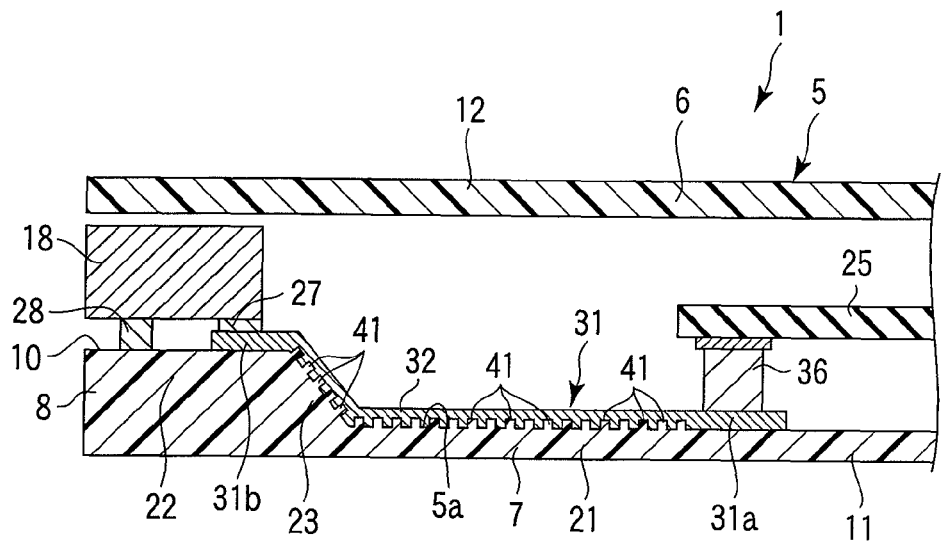
FIG. 8 is an exemplary cross-sectional view of an example of an electronic apparatus according to a third embodiment.
Figure 9A:
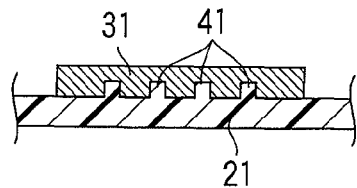
FIGS. 9A, 9B and 9C are exemplary cross-sectional views illustrating several examples of a first portion according to the third embodiment.
Figure 9B:
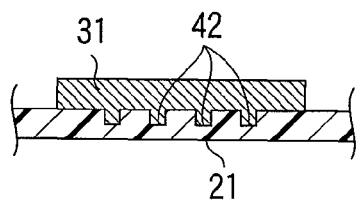

As shown in FIG. 8, in the third embodiment, protrusions, recesses, and the like are formed not only at a slope 23 but also at a surface of a first portion 21. That is, the first portion 21 may have a plurality of protrusions 41 (see FIG. 9A), may have a plurality of recesses 42 (see FIG. 9B), or may have both the protrusions 41 and the recesses 42.

Figure 9C:
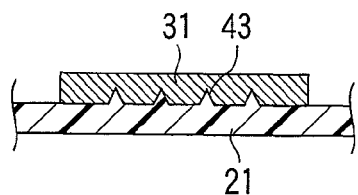

Also, the first portion 21 may have, for example, a rough surface 43 (see FIG. 9C). The surface roughness of the first portion 21 with the rough surface 43 is larger than, for example, a second portion 22. A conductive adhesive 32 is attached to the protrusions 41, the recesses 42, or the rough surface 43. Further, the protrusions 41, the recesses 42, or the rough surface 43 may be formed in various patterns shown in FIGS. 6A to 7E.

According to this configuration, like the first embodiment, it is possible to easily form a wiring pattern g 31 on a step portion in the housing 5.

In the third embodiment, the first portion 21 is provided with the protrusions 41, the recesses 42, or the rough surface 43. According to the first portion 21, like the second embodiment, the conductive adhesive 32 is attached to the protrusions 41, the recesses 42, or the rough surface 43 to improve the adhesion between the conductive adhesive 32 and the housing 5. Therefore, resistance of the wiring pattern 31 against, for example, disconnection is improved and the reliability of the electronic apparatus 1 is improved. Moreover, in the first portion 21 with the protrusions 41, the recesses 42, or the rough surface 43, it is easy to maintain the position of the pre-hardening conductive adhesive 32 applied to the first portion 21.

Also, it is not absolutely necessary to form the protrusions 41, the recesses 42, or the rough surface 43 at the slope 23 and the protrusions 41, the recesses 42, or the rough surface 43 may be formed only at the first portion 21. Further, the protrusions 41, the recesses 42, or the rough surface 43 may be formed at the second portion 22 as well as the slope 23 or the first portion 21 or instead of the slope 23 or the first portion 21. A pair of wall portions (see FIGS. 6E and 7E) standing on both sides of the wiring pattern 31, respectively, may be formed at the first portion 21 and/or the second portion 22.

(Fourth Embodiment)

Figure 10:
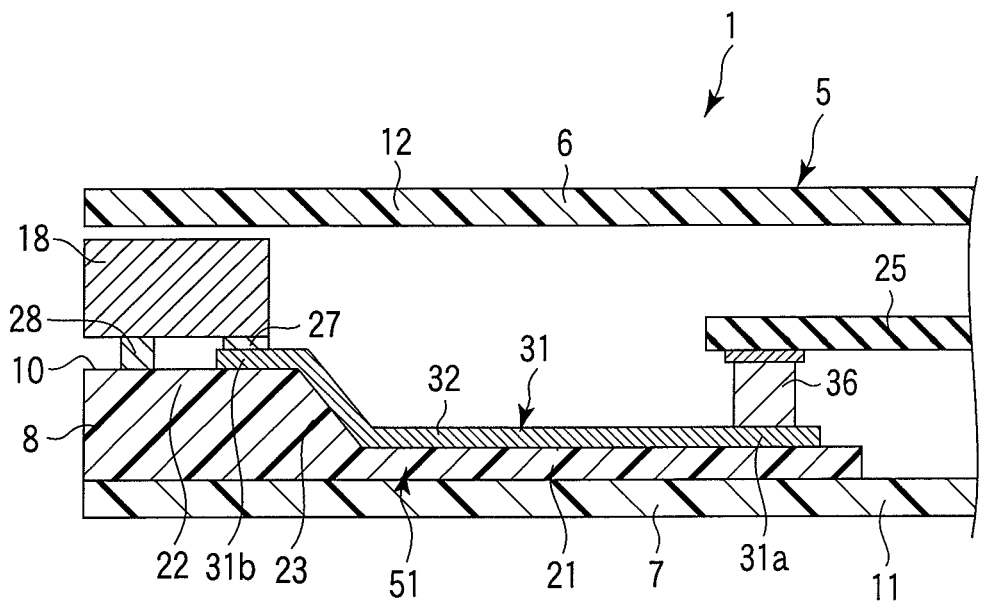
FIG. 10 is an exemplary cross-sectional view of an example of an electronic apparatus according to a fourth embodiment.

Next, an electronic apparatus 1 according to a fourth embodiment will be described with reference to FIG. 10. Further, components having functions which are the same as or similar to the components of the first embodiment are denoted by identical reference symbols, and a description thereof is omitted. Also, components other than components to be described below are the same as those in the first embodiment.

In the electronic apparatus 1 according to the fourth embodiment, a module mounting portion 51 includes a first portion 21, a second portion 22, a slope 23, and a wiring pattern 31 and is formed separately from a housing 5. That is, the first portion 21, the second portion 22, the slope 23, and the wiring pattern 31 are modularized as the module mounting portion 51. The module mounting portion 51 is attached to the housing 5 such that the housing 5 includes the first portion 21, the second portion 22, the slope 23, and the wiring pattern 31.

According to this configuration, like the first embodiment, it is possible to easily form a wiring pattern 31 on a step portion in the housing 5. Further, the module mounting portion 51 may have protrusions 41, recesses 42, or a rough surface 43 similar to those in the second embodiment or the third embodiment.

(Fifth Embodiment)

Next, an electronic apparatus 1 according to a fifth embodiment will be described with reference to FIG. 11. Further, components having functions which are the same as or similar to the components of the first embodiment are denoted by identical reference symbols, and a description thereof is omitted. Also, components other than components to be described below are the same as those in the first embodiment.

Figure 11:
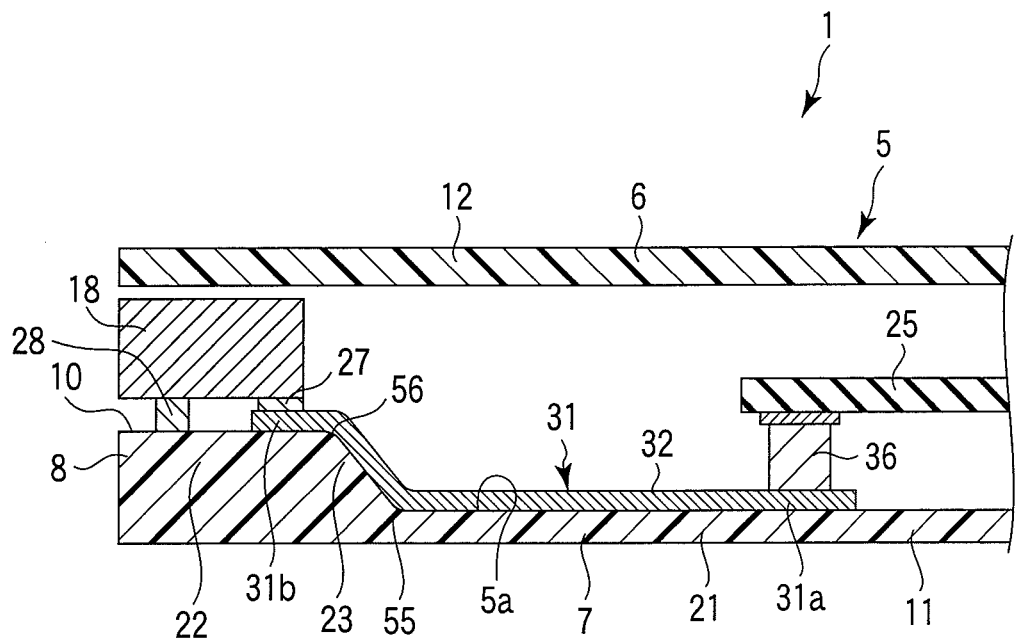
FIG. 11 is an exemplary cross-sectional view of an example of an electronic apparatus according to a fifth embodiment.

As shown in FIG. 11, a housing 5 of the electronic apparatus 1 includes a first portion 21, a second portion 22, and a slope 23. A first curved portion 55 and a second curved portion 56 are at both ends of the slope 23, that is, at portions of the slope 23 connected to the first portion 21 and the second portion 22, respectively. The first curved portion 55 and the second curved portion 56 are at the portions of the slope 23 to have, for example, an arc-shaped cross section. Also, the first curved portion 55 and the second curved portion 56 may be at the first portion 21 and the second portion 22.

According to this configuration, similar to the first embodiment, it is possible to easily form a wiring pattern 31 on a step portion in the housing 5. Further, the housing 5 of the electronic apparatus 1 according to the fifth embodiment may have the configurations according to the second to fourth embodiments in addition to the first curved portion 55 and the second curved portion 56.

(Sixth Embodiment)

Next, a television 61 according to a sixth embodiment will be described with reference to FIG. 12. Further, components having functions which are the same as or similar to the components of the first embodiment are denoted by identical reference symbols, and a description thereof is omitted. Also, components other than components to be described below are the same as those in the first embodiment.

As shown in FIG. 12, a housing 5 of the television 61 includes a first portion 21, a second portion 22, and a slope 23. At the second portion 22, a module 62 is mounted. The module 62 is various kinds of semiconductor chips such as a connector 18 or a ball grid array (BGA), or various kinds of electronic components such as resistors, capacitors, and transistors. On the slope 23, a wiring pattern 31 is formed.

According to this configuration, like the first embodiment, it is possible to easily form the wiring pattern 31 on a step portion in the housing 5. Also, the housing 5 of the television 61 may have the configurations according to the second to fifth embodiments.

As described above, according to the configurations according to the first to sixth embodiments, it is possible to easily form the wiring pattern 31 on a step portion in the housing 5.

Further, the embodiment is not limited to the embodiments but may be implemented by modifying components without departing from the scope of the invention. Also, various embodiments may be made by appropriate combinations of a plurality of components disclosed in the embodiments. For example, it is possible to omit several components from all components disclosed in the embodiments. Further, components of different embodiments may be appropriately combined.

For example, as a method of applying the conductive adhesive 32, methods such as screen print may be used instead of the method using the dispenser 34. Also, the wiring pattern 31 is not limited to the conductive adhesive 32 but may be formed, for example, by attaching a circuit formed on a conductive sheet.

Even though these methods are used, in the case where there is a vertical step portion in a housing 5, it is difficult to form a wiring pattern at the step portion. Meanwhile, if a slope 23 is between a first portion 21 and a second portion 22, it is easy to form a wiring pattern 31 at a step portion in a housing 5 even by methods which do not use a dispenser 34.

The second portion 22 does not need to be in a peripheral portion of a housing 5. The module does not need to be exposed to the outside. That is, the slope 23 or the wiring pattern 31 may be applied to a module to be mounted in a housing 5. The second portion 22 does not need to be higher than the first portion 21 and may be lower than the first portion 21. The module does not need to be at the second portion 22. The module may be at the first portion 21 and may be at the slope 23.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A television comprising:
    a housing comprising a first portion at a first height, a second portion at a second height different from the first height, a slope between the first portion and the second portion, and an opening adjacent to the second portion;
    a connector on the second portion of the housing, the connector being accessible through the opening; and
    a wiring pattern comprising a conductive adhesive on an inner surface of the housing, extending from the first portion to the second portion via the slope and electrically connected to the connector,
    wherein the slope comprises at least one of a protrusion and a recess that are located in a region to which the conductive adhesive is applied, that are brought into contact with the wiring pattern, and that have a longitudinal direction along an extension direction of the wiring pattern,
    wherein a surface roughness of the slope is greater than a surface roughness of the second portion.

2. The television of claim 1,
    wherein the first portion comprises at least one of a protrusion and a recess to which the conductive adhesive is attached.

3. The television of claim 1,
    wherein the slope comprises a first curved portion connected to the first portion, and a second curved portion connected to the second portion.

4. An electronic apparatus, comprising:
    a housing comprising a first portion at a first height, a second portion at a second height different from the first height, and a slope between the first portion and the second portion;
    a module in the housing; and
    a wiring pattern extending from the first portion to the second portion via the slope and electrically connected to the module,
    wherein the slope comprises at least one of a protrusion and a recess that are covered with the wiring pattern and that have a longitudinal direction along a direction from the first portion to the second portion,
    wherein the housing comprises a bottom wall and an opening, the first portion is a portion of the bottom wall, and the second portion is a portion of the bottom wall, which is located in vicinity of the opening.

5. The electronic apparatus of claim 4,
    wherein the slope comprises a first curved portion connected to the first portion, and a second curved portion connected to the second portion.

6. The electronic apparatus of claim 4,
    wherein at least a portion of the module is a connector exposed through the opening.

7. The electronic apparatus of claim 4,
    wherein
    the housing comprises a cover and a base, and
    at least one of the cover and the base comprises a peripheral wall, the peripheral wall comprising the opening.

8. The electronic apparatus of claim 4,
    wherein
    the housing has a flat shape, and the first portion is located at a flat portion of the bottom wall of the housing.

* * * * *